United States Patent [19]
Han

[11] Patent Number: 6,023,436
[45] Date of Patent: Feb. 8, 2000

[54] INTEGRATED CIRCUIT MEMORY DEVICES HAVING SYNCHRONIZED BIT LINE SELECTION AND I/O LINE PRECHARGE CAPABILITY AND METHODS OF OPERATING SAME

[75] Inventor: Yong-joo Han, Kyungki-do, Rep. of Korea

[73] Assignee: Samsung Electronics Co., Ltd., Rep. of Korea

[21] Appl. No.: 09/193,273

[22] Filed: Nov. 17, 1998

[30] Foreign Application Priority Data

Nov. 17, 1997 [KR] Rep. of Korea ........................ 97-60629

[51] Int. Cl.[7] ................................ G11C 7/00; G11C 7/02; G11C 8/00
[52] U.S. Cl. ............................ 365/203; 365/207; 365/233
[58] Field of Search ............................... 365/203, 189.05, 365/194, 230.08, 205, 207, 208, 233

[56] References Cited

U.S. PATENT DOCUMENTS

| | | | |
|---|---|---|---|
| 5,233,560 | 8/1993 | Foss et al. ............................... | 365/203 |
| 5,247,482 | 9/1993 | Kim ....................................... | 365/203 |
| 5,561,630 | 10/1996 | Katoh et al. ............................ | 365/203 |
| 5,870,343 | 2/1999 | Chi et al. ................................ | 365/203 |

Primary Examiner—Trong Phan
Attorney, Agent, or Firm—Myers Bigel Sibley & Sajovec

[57] ABSTRACT

Integrated circuit memory devices having synchronized bit line selection and I/O line precharge capability include an array of memory cells, a pair of differential bit lines electrically coupled to the array of memory cells, a pair of differential input/output lines and a sense amplifier electrically coupled to the pair of differential input/output lines. An equalization circuit is also provided to equalize the potentials of the pair of differential input/output lines in response to a precharge enable signal. A column select circuit is provided to electrically connect the pair of differential bit lines to the pair of differential input/output lines, in response to a column select enable signal. In addition, a control signal generator is provided to generate the column select enable signal and the precharge enable signal during nonoverlapping time intervals and in-sync with an external clock signal. Using these circuits, the timing margins (e.g., overplus operation margin) associated with the enabling of the precharge signal upon the disabling of the column select signal can be advantageously reduced to enable higher speed operation.

29 Claims, 9 Drawing Sheets ns 6,023,436

INTEGRATED CIRCUIT MEMORY DEVICES HAVING SYNCHRONIZED BIT LINE SELECTION AND I/O LINE PRECHARGE CAPABILITY AND METHODS OF OPERATING SAME

FIELD OF THE INVENTION

The present invention relates to integrated circuit memory devices and methods of operating integrated circuit memory devices.

BACKGROUND OF THE INVENTION

Reading data from a row of memory cells in an integrated circuit memory device (e.g., DRAM) typically involves the selection of a row of memory cells connected to a word line in response to a row address and the transfer of data from the selected row of memory cells to a plurality of pairs of precharged and equalized differential bit lines BL and /BL. Sense amplifiers may also be used to sense the potentials of the bit lines and drive the differential bit lines BL and /BL to opposite logic potentials (e.g., logic 0 and logic 1) which represent the value of the data in a respective memory cell. Column address signals can then be used to sequentially transfer data from each of the pairs of differential bit lines BL and /BL to a pair of differential input/output lines IO and /IO, for example. These conventional operations of integrated circuit memory devices are more fully described in U.S. Pat. No. 5,701,268 to Lee et al. entitled "Sense Amplifier for Integrated Circuit Memory Devices Having Boosted Sense and Current Drive Capability and Methods of Operating Same"; U.S. Pat. No. 5,748,529 to Lee entitled "Integrated Circuit Memory Devices Having Direct Read Capability"; and U.S. Pat. No. 5,761,132 to Kim entitled "Integrated Circuit Memory Devices With Latch-Free Page Buffers Therein for Preventing Read Failures", assigned to the present assignee, the disclosures of which are hereby incorporated herein by reference. Other conventional operations for operating integrated circuit memory devices are described in U.S. Pat. No. 5,640,030 to Kenney entitled "Double Dense Ferroelectric Capacitor Cell Memory".

As will be understood by those skilled in the art, an operation to transfer data from a pair of differential bit lines BL and /BL to a pair of differential input/output lines IO and /IO may be preceded by the operations of precharging and equalizing the potentials of the differential input/output lines IO and /IO at an intermediate potential between Vcc and GND (e.g., ½ Vcc). Then, after the transfer of data has taken place in response to a column select signal CSL, for example, an operation is performed to sense and amplify the data which has been transferred to the differential input/output lines IO and /IO. Unfortunately, in conventional integrated circuit memory devices, the timing of the operations to precharge and equalize the potentials of the differential input/output lines are not synchronized with the timing of the operation to transfer data from a pair of differential bit line BL and /BL to the pair of differential input/output lines IO and /IO. As a result, timing penalties may be incurred because excessive timing margins may be required to insure reliable equalization, transfer and sense operations when data in a memory device is being read. Such timing penalties can significantly limit the performance of such memory devices, particularly if the memory devices are expected to operate at extremely high frequencies.

Thus, notwithstanding the above-described integrated circuit memory devices, there continues to be a need for improved memory devices which are less susceptible to timing related penalties.

SUMMARY OF THE INVENTION

It is therefore an object of the present invention to provide improved integrated circuit memory devices and methods of operating same.

It is another object of the present invention to provide integrated circuit memory devices having improved reliability and methods of operating same.

It is a further object of the present invention to provided integrated circuit memory devices which utilize synchronous generation of control signals to reduce timing margins and methods of operating same.

These and other objects, features and advantages of the present invention are provided by memory devices having synchronized bit line selection and I/O line precharge capability. In particular, these memory devices include an array of memory cells, a pair of differential bit lines electrically coupled to the array of memory cells, a pair of differential input/output lines and a sense amplifier electrically coupled to the pair of differential input/output lines. An equalization circuit is also provided to equalize the potentials of the pair of differential input/output lines in response to a precharge enable signal. A column select circuit is provided to electrically connect the pair of differential bit lines to the pair of differential input/output lines, in response to a column select enable signal. In addition, a control signal generator is provided to generate the column select enable signal and the precharge enable signal during nonoverlapping time intervals and in-sync with an external clock signal. Using these circuits, the timing margins (e.g., overplus operation margin) associated with the enabling of the precharge signal upon the disabling of the column select signal can be advantageously reduced to enable higher speed operation.

According to one embodiment of the present invention, a preferred integrated circuit memory device includes an array of memory cells, a differential sense amplifier and driver circuit electrically coupled to differential bit lines BL and /BL and a column select circuit which may contain a transfer gate. The differential sense amplifier and driver circuit performs the function of precharging and sensing the potentials of the differential bit lines BL and /BL and then driving the bit lines BL and /BL rail-to-rail to respective opposite logic potentials depending on the potential of the true bit line BL relative to the complementary bit line /BL. Each transfer gate may contain a pair of pass transistors coupled in series between a respective pair of differential bit lines BL and /BL and differential input/output lines IO and /IO. The transfer gate is responsive to a respective column select signal CSL. A precharge circuit may also be provided for precharging and equalizing the potentials of a respective pair of the differential input/output lines IO and /IO at an intermediate logic potential (e.g., ½ Vcc), in response to a precharge signal IOPRB. A sense amplifier may be provided for sensing the potentials of the differential input/output lines IO and /IO after operations have been performed to: (a) equalize the potentials of the differential input/output lines IO and /IO; and then (b) read the data in the illustrated memory cell by driving the differential bit line pair BL and /BL rail-to-rail and opening the transfer gate to electrically connect the bit line pair BL and /BL to the precharged differential input/output lines IO and /IO. According to a preferred aspect of this embodiment, the precharge signal IOPRB and column select signal CSL should be enabled at respective logic potentials (e.g., logic 1 or logic 0) during nonoverlapping time intervals. It is also preferable that the timing of both the precharge signal IOPRB and column select signal CSL be synchronized to an internally generated clock signal to reduce timing margins and thereby increase the operating speed of the memory device.

In the above described embodiment, a first control signal generator is provided which receives a first external clock signal CLK1 and a first column address AD1, and generates a first column select signal CSL1 and a first precharge signal IOPRB1 which are both synchronized to the first external clock signal CLK1. The first control signal generator may comprise a first internal clock generator, a first preparatory signal generator, a first column select signal generator and a first precharge signal generator. The first internal clock generator generates a first internal clock signal PCLK1 as a series of pulses which are each synchronized to a rising edge of the first external clock signal CLK1. The width of the pulses is independent of the period of the first external clock signal CLK1. In addition, the first preparatory signal generator generates a first select control signal PRECLK1, a second select control signal PCLKDD1, a first precharge control signal PCLKDA1 and a second precharge control signal PRECLKA1. The first column select signal generator is responsive to the first column address and the first and second select control signals PRECLK1 and PCLKDD1, respectively, and the first precharge signal generator is responsive to the first and second precharge control signals PCLKDA1 and PRECLKA1, respectively. According to a further preferred aspect of this embodiment, the second precharge control signal PRECLKA1 may be an inverted and delayed version of the first select control signal PRECLK1 and the second select control signal PCLKDD1 may be a delayed version of the first precharge control signal PCLKDA1.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
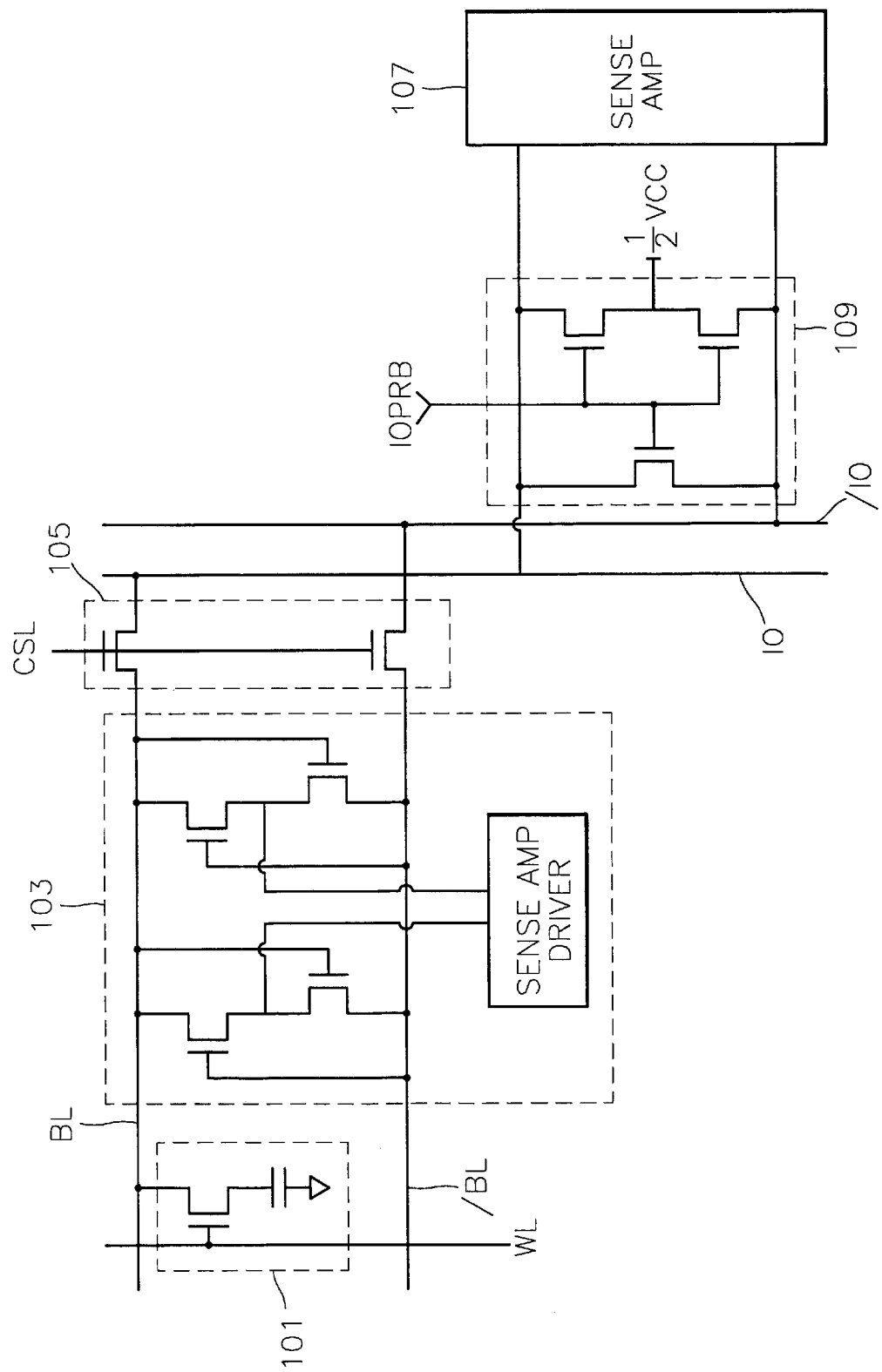
FIG. 1 is an electrical schematic of a portion of an integrated circuit memory device which is responsive to a column select signal CSL and a precharge signal IOPRB, according to an embodiment of the present invention.

Referring now to FIG. 1, a preferred integrated circuit memory device includes an array of memory cells 101 (e.g., DRAM cells), a differential sense amplifier and driver circuit 103 electrically coupled to differential bit lines BL and /BL and a column select circuit which may contain a transfer gate 105. As will be understood by those skilled in the art, the differential sense amplifier and driver circuit 103 may perform the function of precharging and sensing the potentials of the differential bit lines BL and /BL and then driving the bit lines BL and /BL rail-to-rail to respective opposite logic potentials (e.g., logic 1 and logic 0) depending on the potential of the true bit line BL relative to the complementary bit line /BL. As will be understood by those skilled in the art, the complementary bit line /BL may also be coupled to a dummy memory cell (not shown) which stores complementary data relative to the data in the illustrated memory cell 101.

Each transfer gate 105 may contain a pair of pass transistors (e.g., NMOS transistors) coupled in series between a respective pair of differential bit lines BL and /BL and differential input/output lines IO and /IO. The transfer gate 105 is responsive to a respective column select signal CSL which may be enabled by a column address. A precharge circuit 109 may also be provided for precharging and equalizing the potentials of a respective pair of the differential input/output lines IO and /IO at an intermediate logic potential (e.g., ½ Vcc), in response to a precharge signal IOPRB. The precharge circuit 109 may also comprise a plurality of transistors (e.g., NMOS transistors), connected as illustrated. A sense amplifier 107 may also be provided for sensing the potentials of the differential input/output lines IO and /IO after operations have been performed to equalize the potentials of the differential input/output lines IO and /IO and then read the data in the illustrated memory cell 101 by (i) driving the illustrated differential bit line pair BL and /BL rail-to-rail and (ii) opening the transfer gate 105 to electrically connect the bit line pair BL and /BL to the precharged differential input/output lines IO and /IO. Thus, in the illustrated circuit of FIG. 1, it is preferable that the precharge signal IOPRB be driven from 0→1 before the column select signal CSL is driven from 0→1. In particular, the precharge signal IOPRB and column select signal CSL should be enabled during nonoverlapping time intervals. In addition, as described more fully hereinbelow, to achieve higher speed operation it is also preferable that the timing of both the precharge signal IOPRB and column select signal CSL be synchronized to an internally generated clock signal to reduce timing margins and thereby increase the operating speed of the memory device.

Figure 2:
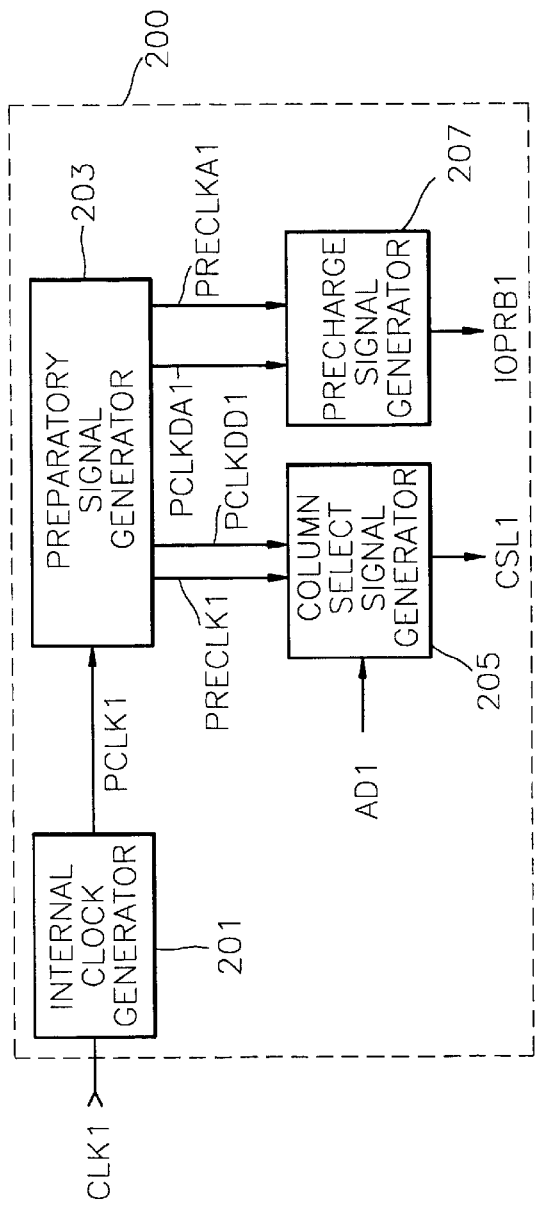
FIG. 2 is a block schematic diagram of a control signal generator according to a first embodiment of the present invention.

Referring now to FIG. 2, a first control signal generator 200 according to a first embodiment of the present invention is illustrated. This first control signal generator 200 receives a first external clock signal CLK1 and a first column address AD1 and generates a first column select signal CSL1 and a first precharge signal IOPRB1 which are both synchronized to the first external clock signal CLK1. The first control signal generator 200 preferably comprises a first internal clock generator 201, a first preparatory signal generator 203, a first column select signal generator 205 and a first precharge signal generator 207.

As illustrated and described more fully hereinbelow, the first internal clock generator 201 generates a first internal clock signal PCLK1 as a series of pulses which are each synchronized to a rising edge of the first external clock signal CLK1. The width of the pulses is independent of the period of the first external clock signal CLK1. In addition, the first preparatory signal generator 203 generates a first select control signal PRECLK1, a second select control signal PCLKDD1, a first precharge control signal PCLKDA1 and a second precharge control signal PRECLKA1. The first column select signal generator 205 is responsive to the first column address and the first and second select control signals PRECLK1 and PCLKDD1, respectively, and the first precharge signal generator 207 is responsive to the first and second precharge control signals PCLKDA1 and PRECLKA1, respectively. As described more fully hereinbelow, the second precharge control signal PRECLKA1 may be an inverted and delayed version of the first select control signal PRECLK1 and the second select control signal PCLKDD1 may be a delayed version of the first precharge control signal PCLKDA1.

Figure 3:
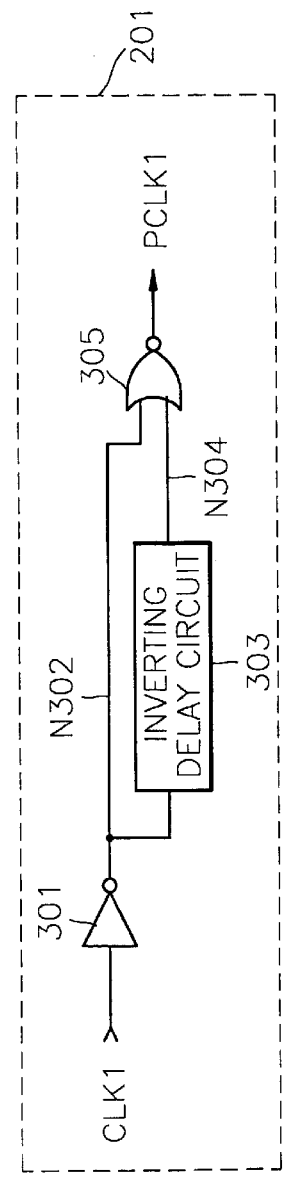
FIG. 3 is an electrical schematic of the internal clock generator of FIG. 2.

Referring now to FIG. 3, a preferred first internal clock generator 201 includes an input inverter 301, an inverting delay circuit 303 and an output NOR gate 305 which has a first input electrically connected to node N302 and a second input electrically connected to node N304. Based on the illustrated interconnection of these devices, a falling edge of the first external clock signal CLK1 will cause node N302 to transition from 0→1 and then cause node N304 to transition from 1→0. The transition of node N302 from 0→1 will hold the first internal clock signal PCLK1 at a logic 0 potential. A rising edge of the first external clock signal CLK1 will cause node N302 to immediately transition from 1→0 and then, after a brief delay which is fixed by the inverting delay circuit 303, node N304 will transition from 0→1. However, prior to the transition from 0→1 at node N304, both inputs to the NOR gate 305 will be temporarily set at a logic 0 potential and this condition will result in the generation of a 0→1→0 pulse at the output PCLK1. The rising edge of this pulse will therefore be synchronized with the rising edge of the first external clock signal CLK1 and the duration of this pulse will be equal to the duration of the delay provided by the inverting delay circuit 303. The duration of the delay is preferably less than ½T, where T is the period of the first external clock signal CLK1.

Figure 4:
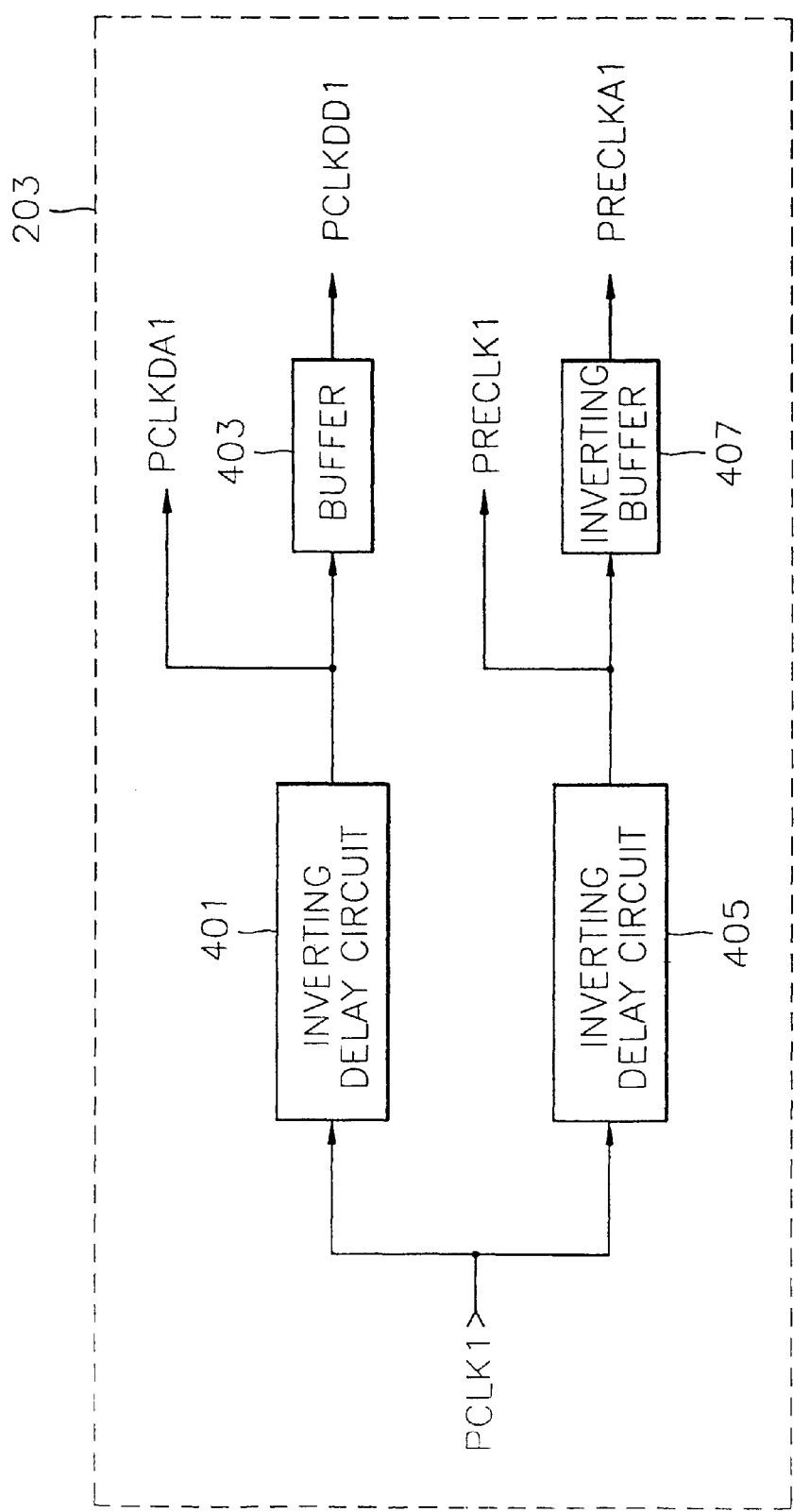
FIG. 4 is a block schematic diagram of the preparatory signal generator of FIG. 2.

Referring now to FIG. 4, the first preparatory signal generator 203 of FIG. 2 includes an inverting delay circuit 401, an inverting delay circuit 405, a noninverting buffer 403 and an inverting buffer 407. As illustrated, the inverting delay circuits 401 and 405 receive the first internal clock signal PCLK1 and generate the first precharge control signal PCLKDA1 and the first select control signal PRECLK1, respectively, as a series of 1→0→1 pulses. However, because the inverting delay circuit 405 provides a shorter delay than the inverting delay circuit 401, the first precharge control signal PCLKDA1 is a similar to a delayed version of the first select control signal PRECLK1. The second select control signal PCLKDD1 is also generated at an output of the noninverting buffer 403, as a slightly delayed version of the first precharge control signal PCLKDA1. In addition, the second precharge control signal PRECLKA1 is also generated at an output of the inverting buffer 407, as a slightly delayed and inverted version of the first select control signal PRECLK1.

Figure 5:
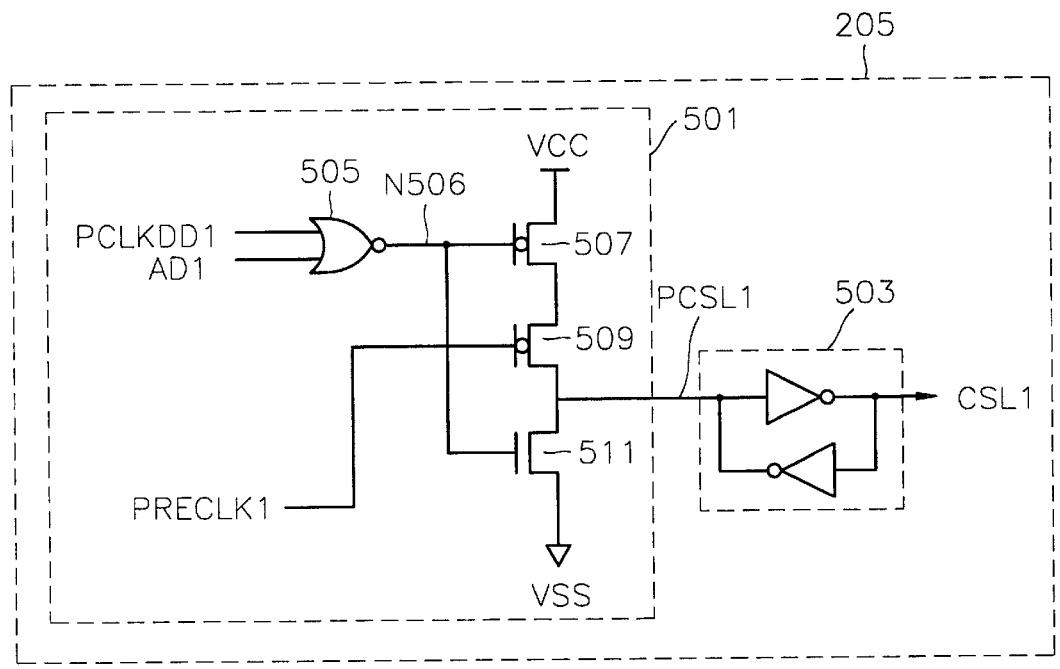
FIG. 5 is an electrical schematic of the column select signal generator of FIG. 2.
Figure 6:
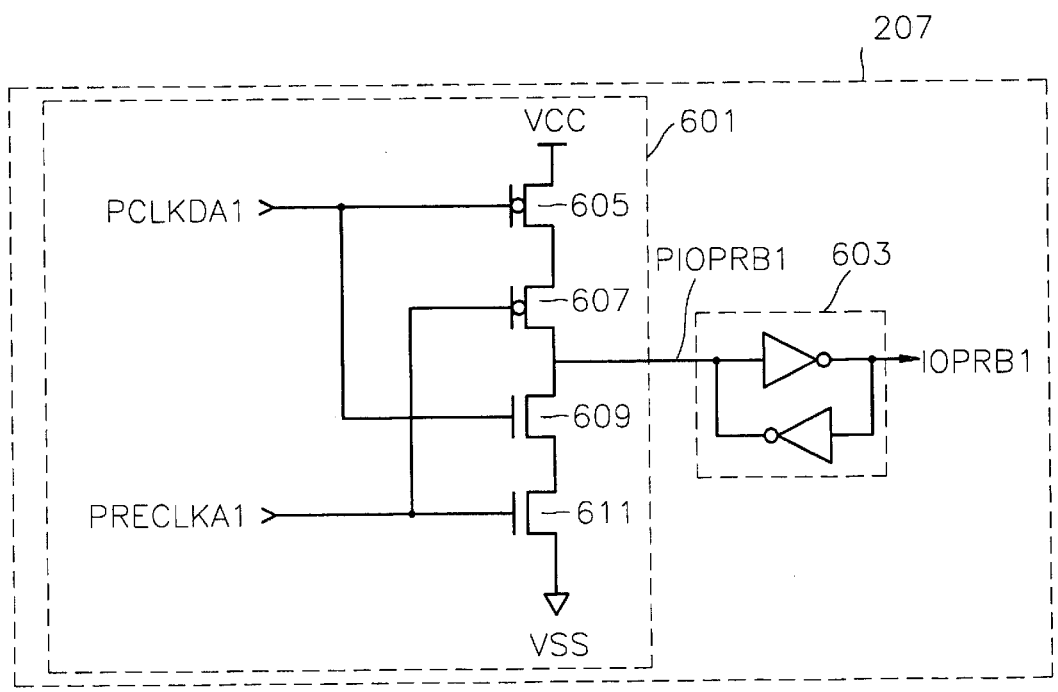
FIG. 6 is an electrical schematic of the precharge signal generator of FIG. 2.

Referring now to FIGS. 5 and 6, preferred electrical schematics of the first column select signal generator 205 and first precharge signal generator 207 will be described. In particular, the first column select signal generator 205 illustrated by FIG. 5 comprises a preparatory column select signal generator 501 and an inverting output latch 503. The preparatory column select signal generator 501 includes a NOR gate 505 which receives the second select control signal PCLKDD1 and the first column address AD1. Two PMOS transistors 507 and 509 and one NMOS transistor 511 are also electrically connected in series between Vcc and Vss, as illustrated. The gate electrode of PMOS transistor 509 also receives the first select control signal PRECLK1. A preparatory first column select signal PCSL1 is generated at an output of the preparatory column select signal generator 501.

As will be understood by those skilled in the art, the output of NOR gate 505 (i.e., node N506) will only be set to a logic 1 potential when both the first column address AD1 and second select control signal PCLKDD1 are set to logic 0 potentials (e.g., when the second select control signal PCLKDD1 transitions from 1→0 while the first column address AD1 is set at a logic 0potential). This will cause the NMOS transistor 511 to turn on and pull the preparatory first column select signal PCSL1 to a logic 0 potential and thereby drive the first column select signal CSL1 to a logic 1 potential. Moreover, whenever either the first column address AD1 or the second select control signal PCLKDD1 are set at a logic 1 potential, PMOS transistor 507 will be turned on. Then, if a 1→0 transition of the first select control signal PRECLK1 takes place to turn on PMOS transistor 509, the preparatory first column select signal PCSL1 will transition to a logic 1 potential and the first column select signal CSL1 will transition to a logic 0 potential, as illustrated by the dotted line in FIG. 7 which is described more fully hereinbelow.

Referring now to FIG. 6, the first precharge signal generator 207 comprises a preparatory precharge signal generator 601, which receives the first precharge control signal PCLKDA1 and second precharge control signal PRECLKA1 and generates a preparatory precharge signal PIOPRB1, and an inverting latch 603. The preparatory precharge signal generator 601 comprises a pair of PMOS transistors 605 and 607 and a pair of NMOS transistors 609 and 611. These PMOS and NMOS transistors are electrically connected in series between Vcc and Vss, as illustrated. In particular, these transistors are connected so that when both the first and second precharge control signals PCLKDA1 and PRECLKA1 are set to a logic 0 potential the first precharge signal IOPRB1 will be latched at a logic 0 potential, and when both the first and second precharge control signals PCLKDA1 and PRECLKA1 are set to a logic 1 potential the first precharge signal IOPRB1 will be latched at a logic 1 potential. The input to the latch 603 will also be set at a high impedance state whenever the first and second precharge control signals PCLKDA1 and PRECLKA1 are set at different logic potentials.

Figure 7:
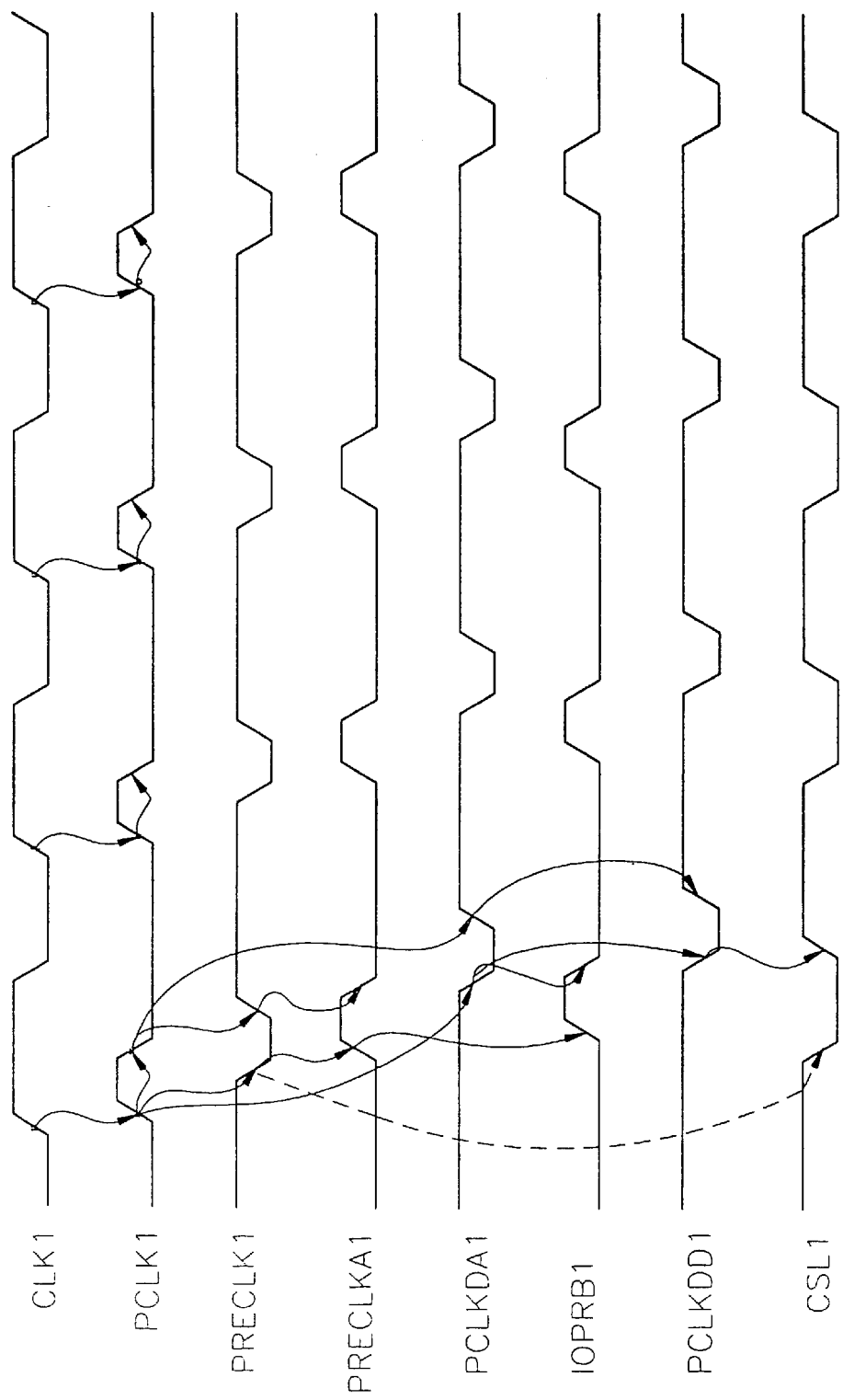
FIG. 7 is a timing diagram which illustrates operation of the control signal generator of FIG. 2.

Referring now to FIG. 7, a timing diagram which illustrates the operation of the first control signal generator 200 will be described. As illustrated, receipt of a first external clock signal CLK1 results in the generation of a first internal clock signal PCLK1 as a series of consecutive 0→1→0 pulses which are triggered by rising edges of the first external clock signal CLK1. The first select control signal PRECLK1 is also generated as an inverted and delayed version of the first internal clock signal PCLK1 and the second precharge control signal PRECLKA1 is generated as a delayed version of the first internal clock signal PCLK1. The first precharge control signal PCLKDA1 is generated as a delayed version of the first internal clock signal PCLK1 and the second select control signal PCLKDD1 is generated as a slightly delayed version of the first precharge control signal PCLKDA1.

As described above, whenever the second select control signal PCLKDD1 and first address signal AD1 are both set at logic 0 potentials, the first column select signal CSL1 will transition from 0→1. In addition, whenever either the second select control signal PCLKDD1 or first address signal AD1 are set to logic 1 potentials when the first select control signal PRECLK1 transitions from 1→0, the first column select signal CSL1 will transition from 1→0. In addition, whenever the first and second precharge control signals PCLKDA1 and PRECLKA1 are both set to logic 1 potentials the first precharge signal IOPRB1 will be set to a logic 1 potential, and whenever the first and second precharge control signals PCLKDA1 and PRECLKA1 are both set to logic 0 potentials the first precharge signal IOPRB1 will be set to a logic 0 potential. Thus, as illustrated, the first column select signal CSL1 is disabled (at a logic 0 potential) whenever the first precharge signal IOPRB1 becomes enabled (at a logic 1 potential). The timing margins associated with the enabling of the first precharge signal IOPRB1 upon the disabling of the first column select signal CSL1 can also be advantageously reduced to enable higher speed operation because both these signals are generated in-sync with the first external clock signal CLK1. In FIGS. 2–7, the first column select signal CSL1 corresponds to the column select signal CSL of FIG. 1, and the first precharge signal IOPRB1 corresponds to the precharge signal IOPRB of FIG. 1.

Figure 8:
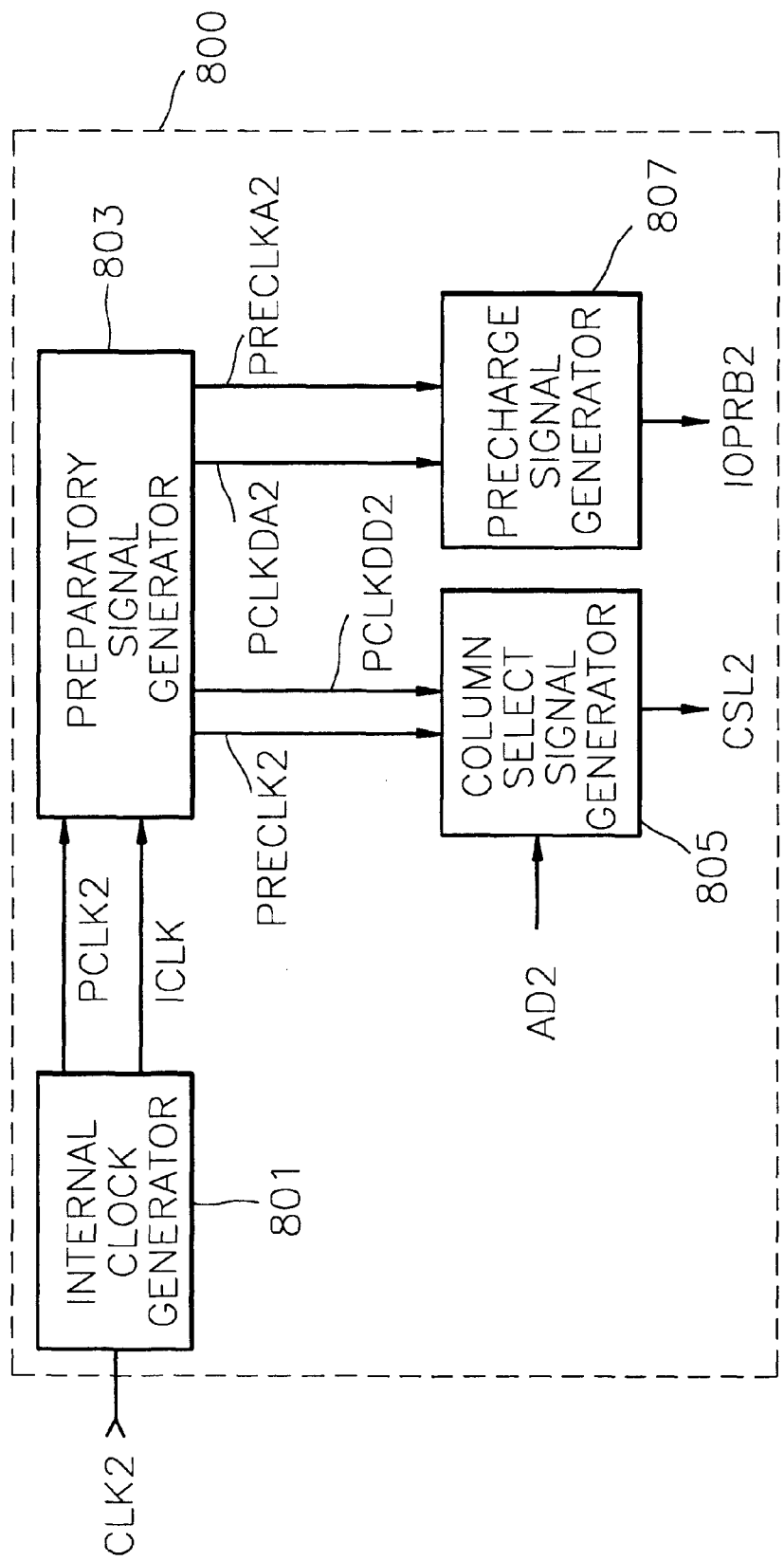
FIG. 8 is a block schematic diagram of a control signal generator according to a second embodiment of the present invention.

Referring now to FIG. 8, a second control signal generator 800 according to a second embodiment of the present invention is illustrated. This second control signal generator 800 receives a second external clock signal CLK2 and a second column address AD2 and generates a second column select signal CSL2 and a second precharge signal IOPRB2 which are synchronized to the second external clock signal CLK2. The second column select signal CSL2 corresponds to the column select signal CSL of FIG. 1, and the second precharge signal IOPRB2 corresponds to the precharge signal IOPRB of FIG. 1. The second control signal generator 800 preferably comprises a second internal clock generator 801, a second preparatory signal generator 803, a second column select signal generator 805 and a second precharge signal generator 807.

As illustrated and described more fully hereinbelow, the second internal clock generator 801 generates a second internal clock signal PCLK2 as a series of pulses which are each synchronized to a rising edge of the second external clock signal CLK2, and also generates a third internal clock signal ICLK as a series of pulses which are each synchronized to a falling edge of the second external clock signal CLK2. The width of the pulses is independent of the period of the second external clock signal CLK2. In addition, the second preparatory signal generator 803 generates a first select control signal PRECLK2, a second select control signal PCLKDD2, a first precharge control signal PCLKDA2 and second precharge control signal PRECLKA2. The second column select signal generator 805 is responsive to the second address signal AD2 and the first and second select control signals PRECLK2 and PCLKDD2, respectively, and the second precharge signal generator 807 is responsive to the first and second precharge control signals PCLKDA2 and PRECLKA2, respectively.

Figure 9:
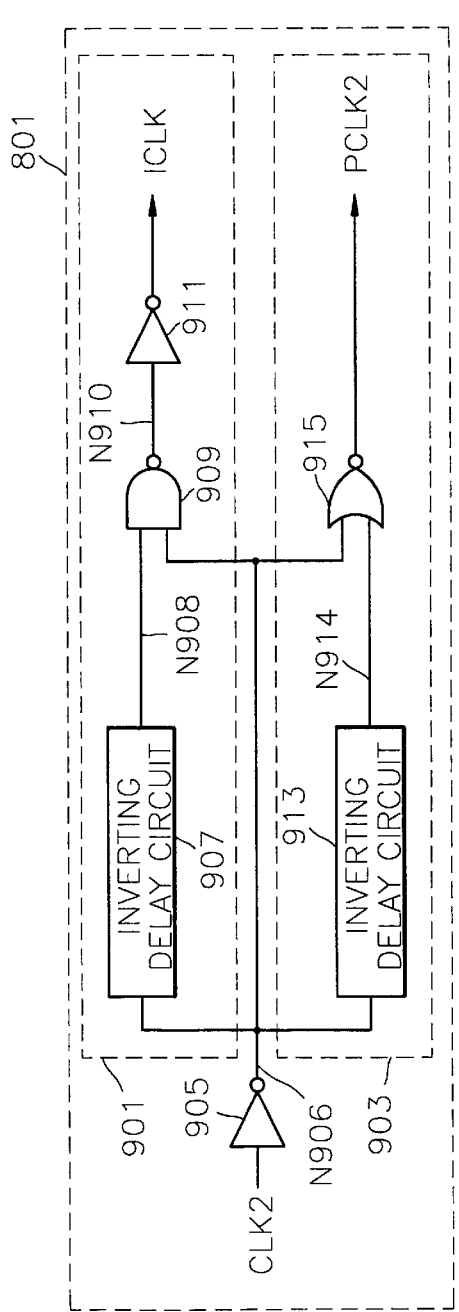
FIG. 9 is an electrical schematic of the internal clock generator of FIG. 8.

Referring now to FIG. 9, a detailed electrical schematic of the second internal clock generator 801 is illustrated. The second internal clock generator 801 includes an input inverter 905 and first and second clock generator circuits 901 and 903, respectively. The first clock generator circuit 901 includes an inverting delay circuit 907 having an input electrically connected to node N906 and an output electrically connected to node N908, a NAND gate 909 having an input electrically connected to node N908, and an output inverter 911 having an input electrically connected to node N910. The NAND gate 909 and output inverter 911 collectively perform the function of an AND gate (not shown). The second clock generator circuit 903 includes an inverting delay circuit 913 having an input electrically connected to node N906 and an output electrically connected to node N914 and an input of a NOR gate 915. As illustrated, node N906 is also electrically connected to inputs of the NOR gate 915 and NAND gate 909.

Figure 13:
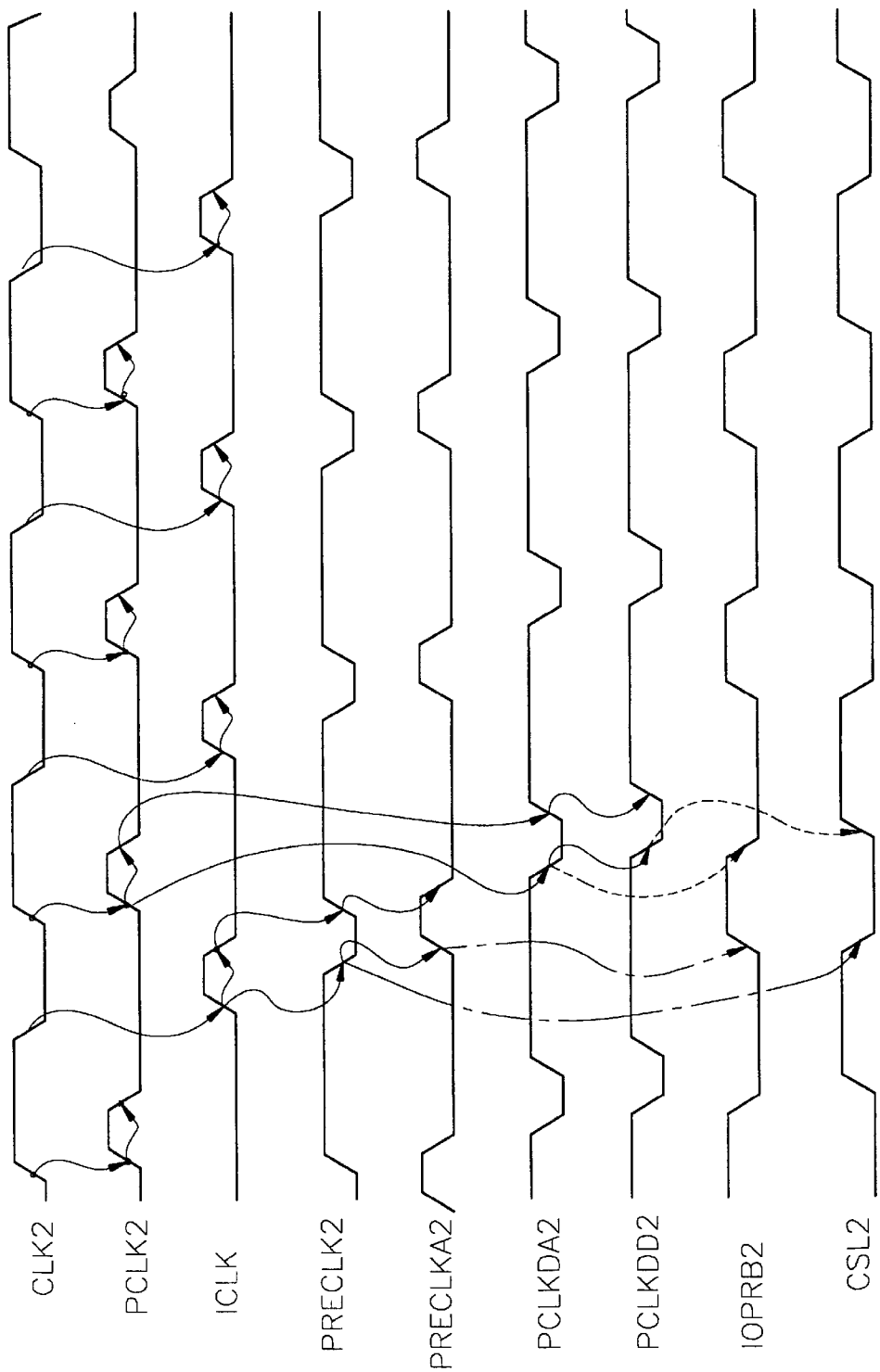
FIG. 13 is a timing diagram which illustrates operation of the control signal generator of FIG. 8.

As will be understood by those skilled in the art, the first clock generator circuit 901 will generate the third internal clock signal ICLK as a series of 0→1→0 pulses which are triggered by falling edges of the second external clock signal CLK2. The second clock generator circuit 903 will generate the second internal clock signal PCLK2 as a series of 0→1→0 pulses which are triggered by rising edges of the second external clock signal CLK2. The timing of these second and third internal clock signals PCLK2 and ICLK is illustrated by FIG. 13 which is described more fully hereinbelow.

Figure 10:
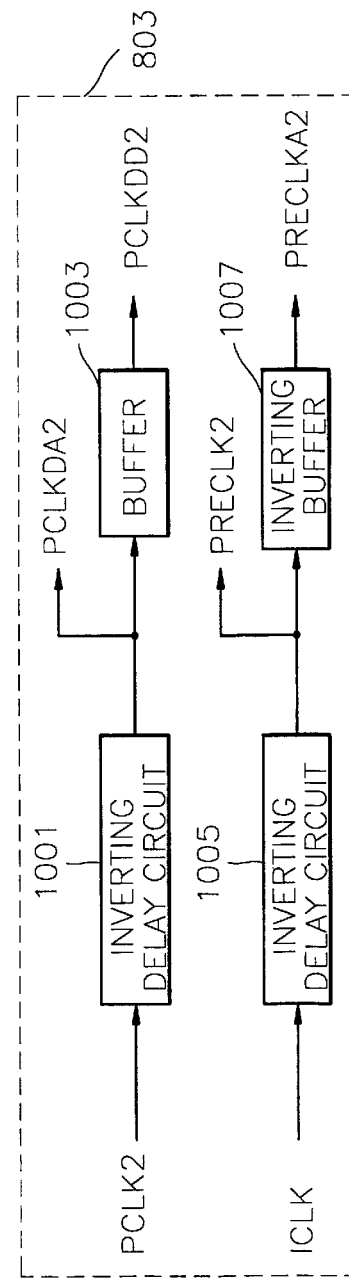
FIG. 10 is a block schematic diagram of the preparatory signal generator of FIG. 8.

Referring now to FIG. 10, the second preparatory signal generator 803 of FIG. 8 comprises a pair of inverting delay circuits 1001 and 1005, a noninverting buffer 1003 and an inverting buffer 1007. Here, the delay associated with the inverting delay circuit 1001 (which receives the second internal clock signal PCLK2) is preferably shorter than the delay associated with the inverting delay circuit 1005 (which receives the third internal clock signal ICLK). Accordingly, as illustrated by FIG. 13, the first precharge control signal PCLKDA2 is a delayed and inverted version of the second internal clock signal PCLK2 and the second select control signal PCLKDD2 is a slightly delayed version of the first precharge control signal PCLKDA2. In addition, the first select control signal PRECLK2 is an inverted and delayed version of the third internal clock signal ICLK and the second precharge control signal PRECLKA2 is an inverted and slightly delayed version of the first select control signal PRECLK2.

Figure 11:
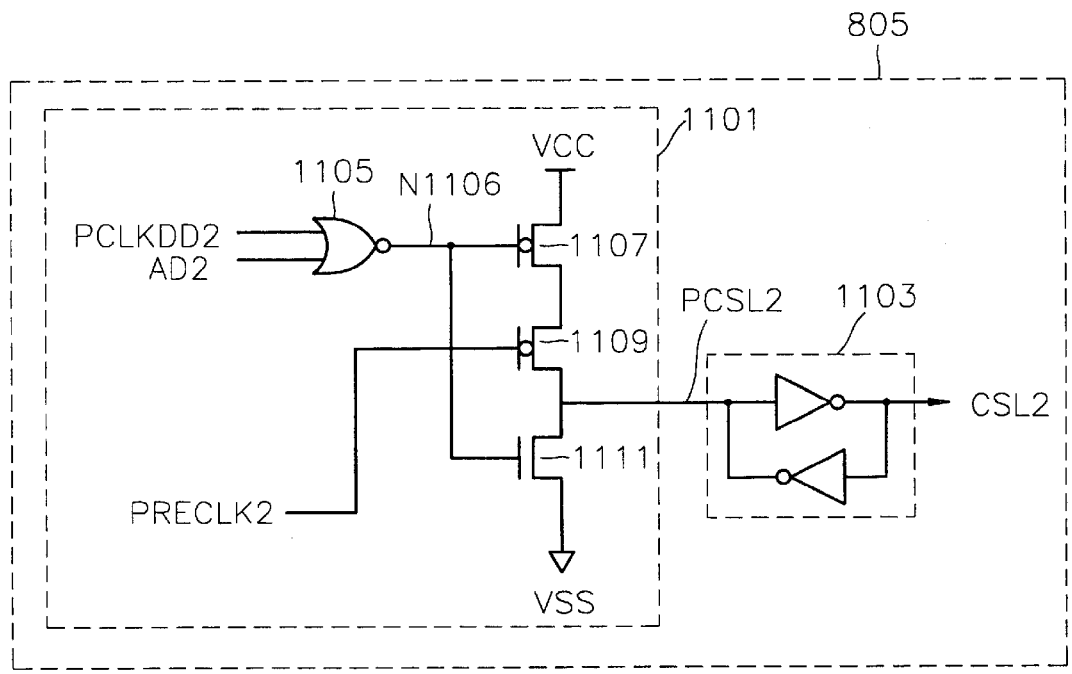
FIG. 11 is an electrical schematic of the column select signal generator of FIG. 8.
Figure 12:
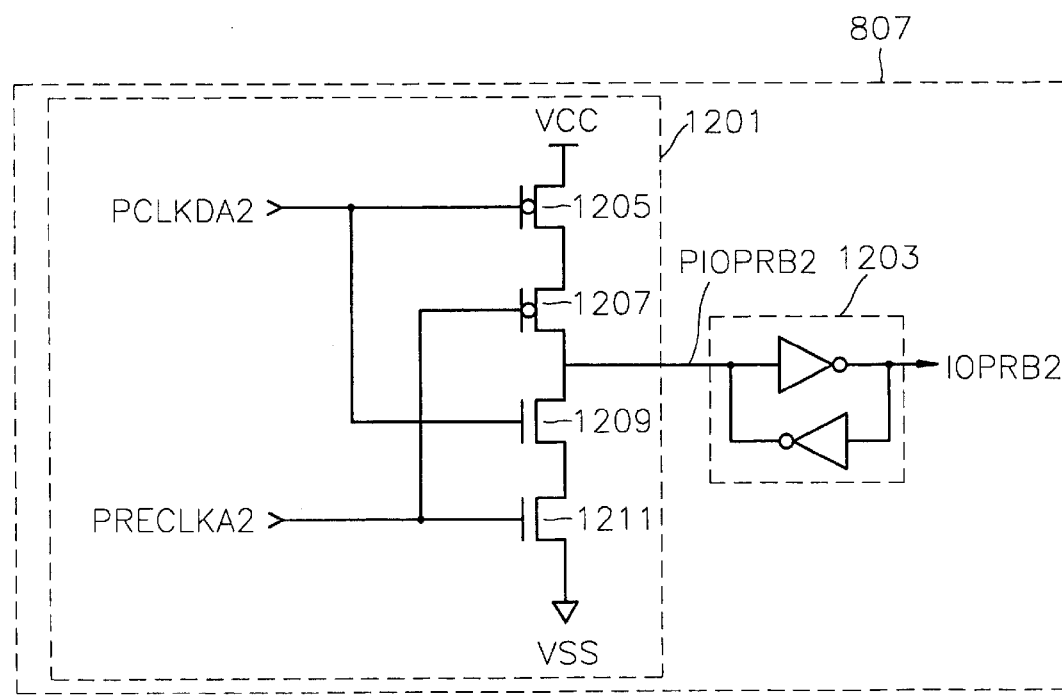
FIG. 12 is an electrical schematic of the precharge signal generator of FIG. 8.

Referring now to FIGS. 11 and 12, preferred electrical schematics of the second column select signal generator 805 and second precharge signal generator 807 will be described, respectively. In particular, the first column select signal generator 805 illustrated by FIG. 11 comprises a preparatory column select signal generator 1101 and an inverting output latch 1103. The preparatory column select signal generator 1101 includes a NOR gate 1105 which receives the second select control signal PCLKDD2 and the second column address AD2. Two PMOS transistors 1107 and 1109 and one NMOS transistor 1111 are electrically connected in series between VCC and VSS, as illustrated. The gate electrode of PMOS transistor 1109 also receives the first select control signal PRECLK2. A preparatory second column select signal PCSL2 is generated at an output of the preparatory column select signal generator 1101.

As will be understood by those skilled in the art, the output of NOR gate 1105 (i.e., node N1106) will only be set to a logic 1 potential when both the second column address AD2 and second select control signal PCLKDD2 are set to logic 0 potentials (e.g., when the second select control signal PCLKDD2 transitions from 1→0 while the second column address AD2 is set at a logic 0 potential). This will cause the NMOS transistor 1111 to turn on and pull down the preparatory second column select signal PCSL2 to a logic 0 potential and thereby drive the second column select signal CSL2 to a logic 1 potential. Moreover, whenever either the second column address AD2 or the second select control signal PCLKDD2 are set at a logic 1 potential, PMOS transistor 1107 will be turned on, and then a 1→0 transition of the first select control signal PRECLK2 will turn on PMOS transistor 1109. This will cause the preparatory second column select signal PCSL2 to transition to a logic 1 potential and the second column select signal CSL2 to transition to a logic 0 potential, as illustrated by the dotted line in FIG. 13 which is described more fully hereinbelow.

Referring now to FIG. 12, the second precharge signal generator 807 comprises a preparatory precharge signal generator 1201 which receives the first precharge control signal PCLKDA2 and second precharge control signal PRECLKA2 and generates a preparatory precharge signal PIOPRB2, and an inverting latch 1203. The preparatory precharge signal generator 1201 comprises a pair of PMOS transistors 1205 and 1207 and a pair of NMOS transistors 1209 and 1211. These PMOS and NMOS transistors are electrically connected in series between Vcc and Vss, as illustrated. In particular, these transistors are connected so that when both the first and second precharge control signals PCLKDA2 and PRECLKA2 are set to a logic 0 potential, the second precharge signal IOPRB2 will be latched at a logic 0 potential and when both the first and second precharge control signals PCLKDA2 and PRECLKA2 are set to a logic 1 potential, the second precharge signal IOPRB2 will be latched at a logic 1 potential. The input to the latch 1203 will also be set at a high impedance state whenever the first and second precharge control signals PCLKDA2 and PRECLKA2 are set at different potentials.

Referring now to FIG. 13, a timing diagram which illustrates the operation of the second control signal generator 800 will be described. As illustrated, receipt of a second external clock signal CLK2 results in the generation of a second internal clock signal PCLK2 as a series of consecutive 0→1→0 pulses which are triggered by rising edges of the second external clock signal CLK2, and a third internal clock signal ICLK as a series of consecutive 0→1→0 pulses which are triggered by falling edges of the second external clock signal CLK2. The first select control signal PRECLK2 is also generated as an inverted and delayed version of the third internal clock signal ICLK and the second precharge control signal PRECLKA2 is generated as an inverted and delayed version of the first select control signal PRECLK2 (i.e., as a delayed version of the third internal clock signal ICLK). The first precharge control signal PCLKDA2 is generated as an inverted and delayed version of the second internal clock signal PCLK2 and the second select control signal PCLKDD2 is generated as a slightly delayed version of the first precharge control signal PCLKDA2. Moreover, as described above with respect to FIGS. 11–12, whenever the second select control signal PCLKDD2 and second address signal AD2 are both set at logic 0 potentials, the second column select signal CSL2 will transition from 0→1. In addition, whenever either the second select control signal PCLKDD2 or second address signal AD2 are set to logic 1 potentials when the first select control signal PRECLK2 transitions from 1→0, the second column select signal CSL2 will transition from 1→0. Furthermore, whenever the first and second precharge control signals PCLKDA2 and PRECLKA2 are both set to logic 1 potentials, the second precharge signal IOPRB2 will also be set to a logic 1 potential and whenever the first and second precharge control signals PCLKDA2 and PRECLKA2 are both set to logic 0 potentials, the second precharge signal IOPRB2 will also be set to a logic 0 potential.

Thus, as illustrated, the second column select signal CSL2 is disabled (at a logic 0 potential) whenever the second precharge signal IOPRB2 becomes enabled (at a logic 1 potential). The timing margins (e.g., overplus operation margin) associated with the enabling of the second precharge signal IOPRB2 upon the disabling of the second column select signal CSL2 can also be advantageously reduced to enable higher speed operation because both these signals are generated in-sync with the second external clock signal CLK2. The timing of the precharge and column select signals are also less dependent on variations in frequency of the external clock signals.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
a pair of differential bit lines;
a pair of differential input/output lines;
means, responsive to a first clock signal, for generating, during respective nonoverlapping time intervals, an enabled select signal and an enabled precharge signal which are both in-sync with the clock signal;
means, responsive to the enabled precharge signal, for equalizing potentials of said pair of differential input/output lines at a first potential; and
means, responsive to the enabled select signal, for electrically connecting said pair of differential bit lines to said pair of differential input/output lines.

2. The memory device of claim 1, wherein said means for generating an enabled select signal and an enabled precharge signal comprises an internal clock generator and a preparatory signal generator.

3. The memory device of claim 2, wherein said internal clock generator has an input which receives the first clock signal and an output which generates a second clock signal as a series of pulses which each have a duration less than one-half a period of the first clock signal.

4. The memory device of claim 3, wherein said preparatory signal generator has an input which receives the second clock signal and an output which generates first and second select control signals and first and second precharge control signals.

5. The memory device of claim 4, wherein said means for generating an enabled select signal and an enabled precharge signal further comprises a select signal generator and a precharge signal generator; wherein said select signal generator is responsive to the first and second select control signals; and wherein said precharge signal generator is responsive to the first and second precharge control signals.

6. The memory device of claim 5, wherein the second precharge control signal is an inverted and delayed signal relative to the first select control signal; and wherein the second select control signal is a delayed signal relative to the first precharge control signal.

7. The memory device of claim 6, wherein the first select control signal is an inverted and delayed signal relative to the second clock signal; and wherein the first precharge control signal is an inverted and delayed signal relative to the second clock signal.

8. The memory device of claim 7, wherein the first precharge control signal is a delayed signal relative to the first select control signal.

9. The memory device of claim 2, wherein said internal clock generator has an input which receives the first clock signal and an output which generates a second clock signal as a first train of pulses and a third clock signal as a second train of pulses which is out-of-phase relative to the first train of pulses.

10. The memory device of claim 9, wherein the second clock signal is synchronized to rising edges of the first clock signal; and wherein the third clock signal is synchronized to falling edges of the first clock signal.

11. The memory device of claim 9, wherein said preparatory signal generator has an input which receives the second and third clock signals and an output which generates first and second select control signals and first and second precharge control signals.

12. The memory device of claim 11, wherein said means for generating an enabled select signal and an enabled precharge signal further comprises a select signal generator and a precharge signal generator; wherein said select signal generator is responsive to the first and second select control signals; and wherein said precharge signal generator is responsive to the first and second precharge control signals.

13. The memory device of claim 12, wherein the second precharge control signal is an inverted and delayed signal relative to the first select control signal; and wherein the second select control signal is a delayed signal relative to the first precharge control signal.

14. The memory device of claim 13, wherein the first select control signal is an inverted and delayed signal relative to the third clock signal; and wherein the first precharge control signal is an inverted and delayed signal relative to the second clock signal.

15. The memory device of claim 3, wherein said internal clock generator comprises an input inverter, an inverting delay circuit having an input electrically coupled to an output of the input inverter, and a NOR gate having first and second inputs electrically coupled to the output of the input inverter and an output of the inverting delay circuit, respectively.

16. The memory device of claim 3, wherein said internal clock generator comprises:
an input inverter;
a first inverting delay circuit having an input electrically coupled to an output of the input inverter;
a second inverting delay circuit having an input electrically coupled to the output of the input inverter;
an AND circuit having first and second inputs electrically coupled to an output of the first inverting delay circuit and the output of the input inverter, respectively; and
a NOR gate having first and second inputs electrically coupled to an output of the second inverting delay circuit and the output of the input inverter, respectively.

17. The memory device of claim 4, wherein said preparatory signal generator comprises:
first and second inverting delay circuits;
a buffer having an input electrically coupled to an output of said first inverting delay circuit; and
an inverting buffer having an input electrically coupled to an output of said second inverting delay circuit.

18. The memory device of claim 17, wherein a delay associated with said second inverting delay circuit is less than a delay associated with said first inverting delay circuit.

19. The memory device of claim 9, wherein said preparatory signal generator comprises:
a first inverting delay circuit having an input which receives the second clock signal;
a second inverting delay circuit having an input which receives the third clock signal;
a buffer having an input electrically coupled to an output of said first inverting delay circuit; and
an inverting buffer having an input electrically coupled to an output of said second inverting delay circuit.

20. An integrated circuit memory device, comprising:
an array of memory cells;
a pair of differential bit lines electrically coupled to said array of memory cells;
a pair of differential input/output lines;
a sense amplifier electrically coupled to said pair of differential input/output lines;
means, electrically coupled to a precharge signal line, for equalizing potentials of said pair of differential input/output lines;
means, electrically coupled to a select signal line, for electrically connecting said pair of differential bit lines to said pair of differential input/output lines; and
a control signal generator having an input electrically coupled to a clock signal line and select and precharge outputs electrically coupled to the select and precharge signal lines, respectively, said control signal generator comprising an internal clock generator, a preparatory signal generator, a select signal generator that generates an enabled select signal that is synchronized to an input of said internal clock generator and a precharge signal generator that generates an enabled precharge signal that is synchronized to the input of said internal clock generator and nonoverlapping in time with the enabled select signal.

21. The memory device of claim 20, wherein said means for electrically connecting said pair of differential bit lines to said pair of differential input/output lines comprises a transfer gate containing pass transistors therein.

22. The memory device of claim 20, wherein said preparatory signal generator comprises:
first and second inverting delay circuits;
a buffer electrically coupled to an output of said first inverting delay circuit; and
an inverting buffer electrically coupled to an output of said second inverting delay circuit.

23. The memory device of claim 22, wherein said select signal generator comprises:
a preparatory select signal generator which generates a preparatory select signal at an output thereof; and
a latch having an input electrically coupled to an output of said preparatory select signal generator and an output electrically coupled to the select signal line.

24. The memory device of claim 23, wherein said precharge signal generator comprises:
a preparatory precharge signal generator which generates a preparatory precharge signal at an output thereof; and
a latch having an input electrically coupled to an output of said preparatory precharge signal generator and an output electrically coupled to the precharge signal line.

25. In an integrated circuit memory device containing a pair of differential bit lines and a pair of differential input/ output lines, a method of operating the memory device, comprising the steps of:

generating a precharge enable signal and a select enable signal which are both synchronized to a first clock signal, during nonoverlapping time intervals;

equalizing potentials of the pair of differential input/output lines in response to the precharge enable signal; and electrically connecting the pair of differential input/output lines to the pair of differential bit lines in response to the select enable signal.

26. The method of claim 25, wherein said generating step comprises the steps of:

generating a precharge enable signal as a first train of pulses; and generating a select enable signal as a second train of pulses which are nonoverlapping in time with the pulses of the first train.

27. The method of claim 26, wherein said step of generating a precharge enable signal and a select enable signal comprises the step of generating a second clock signal as a series of pulses which each have a pulse width less than one-half a period of the first clock signal.

28. The method of claim 27, wherein said step of generating a precharge enable signal and a select enable signal comprises the steps of:

generating first and second select control signals from the second clock signal; and generating first and second precharge control signals from the second clock signal; and wherein the second precharge control signal is an inverted and delayed signal relative to the first select control signal and the second select control signal is a delayed signal relative to the first precharge control signal.

29. The method of claim 28, wherein the first select control signal is an inverted and delayed signal relative to the second clock signal; and wherein the first precharge control signal is an inverted and delayed signal relative to the second clock signal.

* * * * *